(12) United States Patent
Sugimura et al.

(10) Patent No.: US 11,318,439 B2
(45) Date of Patent: *May 3, 2022

(54) SURFACE MODIFICATION DEVICE

(71) Applicant: KASUGA DENKI, INC., Kawasaki (JP)

(72) Inventors: Satoshi Sugimura, Kawasaki (JP); Satoru Ogiso, Kawasaki (JP); Yukihira Sakurai, Kawasaki (JP); Junya Yoshida, Kawasaki (JP); Takao Morishita, Kawasaki (JP)

(73) Assignee: KASUGA DENKI, INC., Kanagawa (JP)

( * ) Notice: Subject to any disclaimer, the term of this patent is extended or adjusted under 35 U.S.C. 154(b) by 97 days.

This patent is subject to a terminal disclaimer.

(21) Appl. No.: 16/637,247

(22) PCT Filed: Aug. 7, 2018

(86) PCT No.: PCT/JP2018/029541
§ 371 (c)(1),
(2) Date: Feb. 6, 2020

(87) PCT Pub. No.: WO2019/031480
PCT Pub. Date: Feb. 14, 2019

(65) Prior Publication Data
US 2020/0246773 A1     Aug. 6, 2020

(30) Foreign Application Priority Data

Aug. 9, 2017   (JP) .............................. JP2017-154185

(51) Int. Cl.
*B01J 19/08*    (2006.01)
*H05H 1/24*     (2006.01)

(52) U.S. Cl.
CPC ................ *B01J 19/08* (2013.01); *H05H 1/24* (2013.01)

(58) Field of Classification Search
CPC .. B01J 19/08; H05H 1/24; H05H 1/48; H05H 1/47; H05H 1/471; H05H 2245/36;
(Continued)

(56) References Cited

U.S. PATENT DOCUMENTS 4,940,521 A     1/1990   Dinter et al.
5,304,407 A  *  4/1994   Hayashi ................ C23C 16/452
                                                    427/255.5
(Continued)

FOREIGN PATENT DOCUMENTS

JP          58-225132       12/1983
JP           S59440          1/1984
(Continued)

*Primary Examiner* — Xiuyu Tai
(74) *Attorney, Agent, or Firm* — Edward M. Weisz (57) ABSTRACT

Surface modification device forms a discharge area E1 between a discharge electrode 6 and a counter electrode 4, supplies substitution gas to the discharge area E1, and modifies the surface of the base material to be processed. The surface modification device comprises; a slit-shaped substitution gas passage; and cover members 7, 8 that form curtain passages 22, 23 in spaces facing the discharge electrode. While the substitution gas is being supplied to the discharge area E1, gas injected from the curtain passages 22, 23 prevent the inflow of an entrained flow a and the outflows b1, b2 of the substitution gas, thereby maintaining the concentration of substitution gas inside the discharge area E1.

12 Claims, 6 Drawing Sheets

(58) Field of Classification Search
CPC .... B29C 59/12; B29C 71/04; H01J 37/32541; H01J 37/32073; H01J 37/3277; H01J 37/32568; H01J 37/3244; H01J 2237/33; H01T 19/00; C23C 4/12; B32B 5/16; B05C 9/02; B05D 3/14; B05D 1/62; B05D 3/145; B05D 5/08

See application file for complete search history.

(56) References Cited

U.S. PATENT DOCUMENTS

| | | | | |
|---|---|---|---|---|
| 5,576,076 | A * | 11/1996 | Slootman | C23C 16/402 427/255.37 |
| 6,099,810 | A * | 8/2000 | Bloss | B29C 59/12 422/186.04 |
| 6,849,306 | B2 * | 2/2005 | Fukuda | H01J 37/32825 427/562 |
| 2007/0095476 | A1 * | 5/2007 | Saeki | H05H 1/48 156/345.43 |

FOREIGN PATENT DOCUMENTS

| | | |
|---|---|---|
| JP | 2-99163 | 4/1990 |
| JP | 6-2830 | 1/1994 |
| JP | 9-92493 | 4/1997 |
| JP | 2001-131313 | 5/2001 |
| JP | 2002-292272 | 10/2002 |

* cited by examiner

SURFACE MODIFICATION DEVICE

PRIORITY CLAIM

This is a U.S. national stage of application No. PCT/JP2018/029541, filed on Aug. 7, 2018. Priority is claimed on German Application No. JP 2017-154185, filed Aug. 9, 2017, the content of which is incorporated herein by reference.

TECHNICAL FIELD

The present invention relates to a surface modification device that modifies the surface of a base material by use of discharge energy.

BACKGROUND ART

Surface modification devices of such a type are known which include a discharge electrode disposed within an electrode chamber, and a counter electrode facing the discharge electrode. And, a substitution gas appropriate to desired surface modification is supplied into the electrode chamber, and while substitution gas atmospheres within the electrode chamber is maintained, voltage is applied to the discharge electrode so that a discharge occurs between the discharge electrode and the counter electrode.

Thus, the surface of a base material inserted between the electrodes is modified by the discharge energy.

In such surface modification devices, concentrations and types of the substitution gas in the discharge area have an influence on modified conditions of the base material surface.

The management of concentrations and types of the substitution gas is important, but presents no problem as long as a proper selection is performed because of the predetermined type of the substitution gas.

However, even during discharge, the gas concentration is susceptible to air flowing from outside the chamber.

Therefore, an increase in the amount of supply of substitution gas into the electrode chamber is necessary to maintain the concentration of the substitution gas within the electrode chamber at or higher than a given level. Further, in general, the substitution gases used for surface modification are expensive. This may cause higher cost and productive inefficiency.

To address this, a method to reduce the consumption of substitution gas is known, in which the substitution gas is directly provided locally to a discharge area between the discharge electrode and the counter electrode (see Patent Literatures 1, 2).

Figure 6:
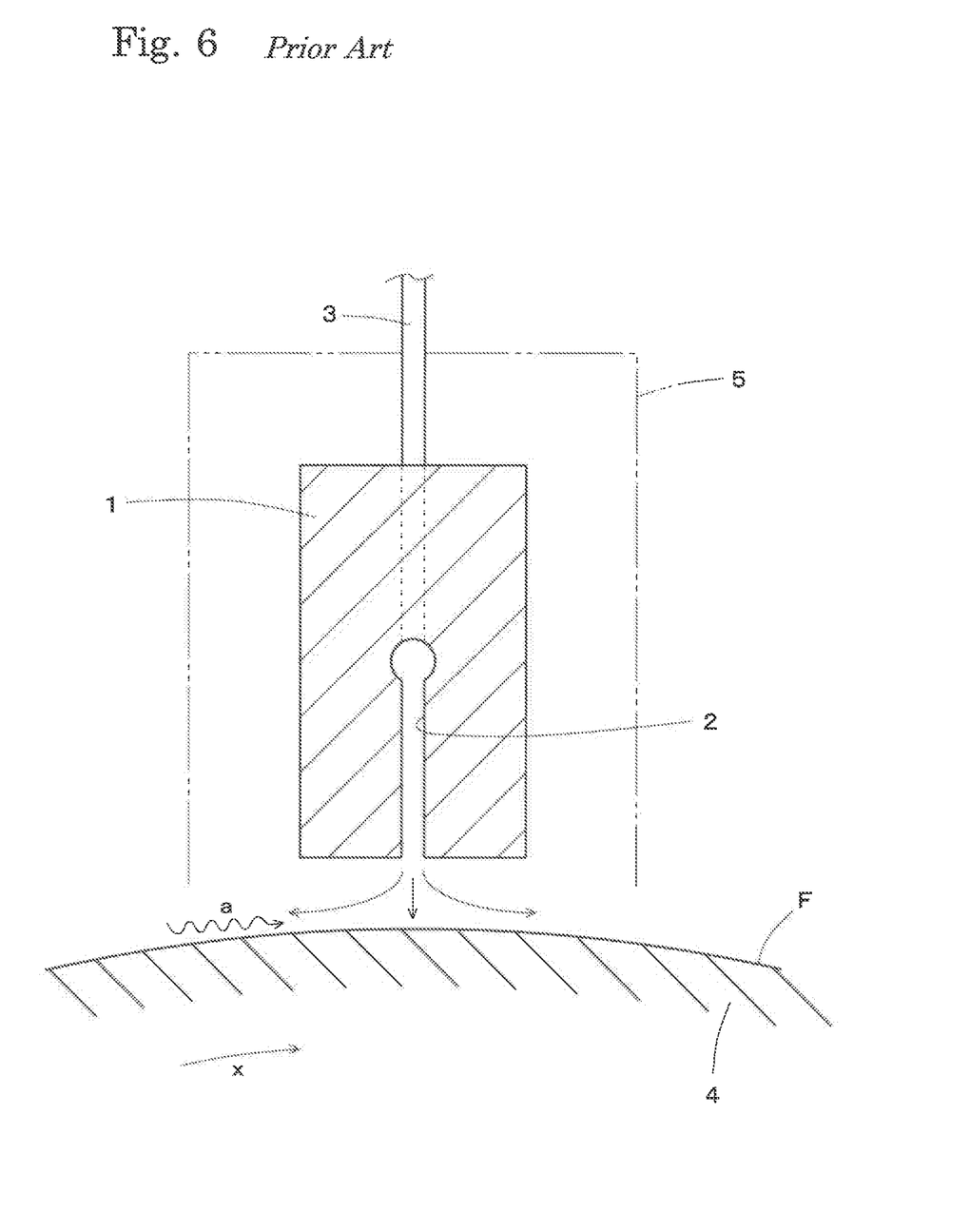
FIG. 6 is a schematic diagram of an example of conventional electrode portions.

For example, in a device illustrated in FIG. 6, a slit-shaped gas passage 2 is formed in a discharge electrode 1 along a longitudinal direction thereof, and a gas supply pipe 3 is connected to the gas passage 2 to supply the substitution gas. And, a film F is transferred by a treatment roller 4 serving as a counter electrode. The substitution gas is then injected from the gas passage 2 toward the film F. Hence, the substitution gas is able to be supplied directly to the discharge area which is a facing region between the discharge electrode 1 and the treatment roller 4. This facilitates maintaining of a constant concentration of the substitution gas in the local area.

As mentioned above, a local supply of the substitution gas enables maintaining of the concentration of the substitution gas at or higher than a fixed level in the local area.

However, since the film F transferred by the treatment roller 4 entrains outside air as shown by the wavy arrow, the substitution gas inevitably declines in concentration with distance from the gas passage 2. In this manner, under conditions of a decrease in substitution gas concentration or of mixing of component (s) of the outside air such as e.g., oxygen, causing discharge makes it likely to preclude desired modification treatment on the film F.

As an possible way to prevent influences of such an entrained flow a, the discharge electrode 1 is surrounded with an electrode chamber 5 as shown by the dash-dot-dot line, so that the substitution gas concentration within the electrode chamber 5 can be maintained high to some extent. In this manner, supplying the substitution gas into the electrode chamber 5 enables a high concentration of the substitution gas being maintained around the discharge electrode 1. Thus, even if the entrained flow a occurs, the influence on the substitution gas concentration in the discharge area can be limited.

However, supplying the substitution gas into the electrode chamber 5 is not conducive to the solution of the problem of increasing the consumption of the substitution gas.

It is an object of the present invention to provide a surface modification device capable of stably performing desired modification treatment with a reduced amount of supply of the substitution gas.

SUMMARY OF INVENTION

A first aspect of the present invention provides a surface modification device configured to supply substitution gas to a discharge area that is formed between a discharge electrode, which has a length in a width direction of a base material and includes one or more electrode members, and a counter electrode facing the discharge electrode, in order for a surface of the base material to be treated by discharge energy. The surface modification device includes: a substitution gas passage that allows substitution gas to be injected toward the discharge area along the discharge electrode; a cover member that includes an insulating material located along the discharge electrode and maintaining a facing gap from the discharge electrode; a gas curtain passage of a slit shape that is formed by the facing gap between the cover member and the discharge electrode; and a support member that is held between the electrode member and the cover member and has a gas guide hole formed therein to communicate with the gas curtain passage. The cover member is mounted either any one or both of an upstream side and a downstream side of the discharge electrode with respect to a moving direction of the base material entering the discharge area formed between the discharge electrode and the counter electrode, and the gas curtain passage is supplied with curtain gas through the gas guide hole.

A second aspect of the present invention provides a surface modification device configured to supply substitution gas to a discharge area that is formed between a discharge electrode, which has a length in a width direction of a base material and includes one or more electrode members, and a counter electrode facing the discharge electrode, in order for a surface of the base material to be treated by discharge energy. The surface modification device includes: a substitution gas passage that allows substitution gas to be injected toward the discharge area along the discharge electrode; a cover member that includes an insulating material located along the discharge electrode and maintaining a facing gap from the discharge electrode; a gas curtain passage of a slit shape that is formed by the facing gap between the cover member and the discharge electrode; a support member that is held between the electrode member and the cover member and has a gas guide hole formed therein to communicate with the gas curtain passage; and a holder that clamps the cover member and the discharge electrode. The cover member and, the discharge electrode and the support member are clamped by the holder, and the cover member is mounted either any one or both of an upstream side and a downstream side of the discharge electrode with respect to a moving direction of the base material entering the discharge area formed between the discharge electrode and the counter electrode. And the gas curtain passage is supplied with curtain gas through the gas guide hole.

In a third aspect of the present invention, the discharge electrode includes an electrode member, and one or more the substitution gas passages of a slit shape along a length direction of the electrode member is formed in the electrode member. And the substitution gas is supplied to the substitution gas passages.

It is noted that the length direction of the electrode member refers to the length direction of the discharge electrode, and the width direction of the base material.

In a fourth aspect of the invention, the discharge electrode includes a plurality of electrode members spaced to maintain a facing gap in a direction intersecting a length direction of the discharge electrode, and the facing gap is configured as the substitution gas passage of a slit shape, and the substitution gas is supplied to the substitution gas passage.

In a fifth aspect of the present invention, the electrode members adjacent to each other face each other with a support member held between them, and the support member has a gas guide hole formed therein to communicate with the gas passage and the substitution gas is supplied to the substitution gas passage through the gas guide hole.

In a sixth aspect of the present invention, the gas curtain passage serves also as a substitution gas passage, and the substitution gas is supplied to the gas curtain passage.

In a seventh aspect of the present invention, the gas curtain passage is supplied with a curtain gas of a different type from the substitution gas.

In an eighth aspect of the present invention, the cover member has a vortex forming mechanism formed at a distal end face on the counter electrode side of the cover member.

According to the present invention, a jet of gas supplied to the gas curtain passage formed in the facing gap between the discharge electrode and the cover member is directed toward the counter electrode to function as a gas curtain. Because of this, an inflow of an entrained flow into the discharge area and an outflow of the substitution gas from the discharge area can be inhibited.

In particular, the gas curtain blocks an entrained flow entrained by the base material to prevent entry of the entrained flow on the upstream side of the discharge electrode with reference to the moving direction of the base material.

In addition, on the downstream side of the discharge electrode, the gas curtain can minimize an outflow of the substitution gas.

Therefore, the amount of substitution gas supplied to the discharge area can be reduced to prevent a reduction in concentration of the substitution gas within the discharge area, enabling an achievement of desired surface modification.

According to the third to fifth aspects of the present invention, because the substitution gas passage is formed within the discharge electrode, the substation gas is capable of being supplied directly to the center of the discharge area. Therefore, the amount of substitution gas flowing outward of the discharge area can be reduced, so that the supplied substitution gas is used effectively for desired modification treatment.

Further, because the substitution gas passage is formed within the discharge electrode, the gas curtain passage extending along the cover member is able to be used only for a gas curtain. Dedicating the gas curtain passage to a gas curtain enables use of curtain gas more inexpensive than the substitution gas, which leads to a reduction in manufacturing costs.

In particularly, according to the fourth aspect of the present invention, the discharge electrode is composed of multiple electrode members and a facing gap each between the multiple electrode members is configured as a substitution gas passage. Thereby, forming the substitution gas passage is facilitated as compared with the case of forming a slit-shaped substitution gas passage in the single electrode member.

In this manner, the discharge electrode including the substitution gas passage can be formed simply by increasing the number of electrode members. Because of this, the number of electrode members can increase to extend the discharge area. If the discharge area is extended, the area to be treated at a time can be extended, which facilitates an increase in throughput speed in the surface modification treatment.

According to the fifth aspect of the present invention, further, the electrode member and the cover member can be supported by the support member and also forming the slit-shaped gas curtain passage and the substitution gas passage can be facilitated, so that accuracy of dimensions such as a passage width and the like can be readily obtained.

According to the sixth aspect of the present invention, the gas curtain passage is configured to serve also as the substitution gas passage. Because of this, the required amount of substitution gas is able to be supplied to the discharge area without the substitution gas passage formed within the discharge electrode.

According to the seventh aspect of the present invention, a relatively inexpensive gas as compared with the substitution gas is able to be used as curtain gas, and thus cost reduction can be achieved.

According to the eighth aspect of the present invention, because the cover member is mounted on the upstream side of the discharge electrode, the entrained flow caused by the movement of the base material can be block to prevent outside air from flowing into the discharge area.

DESCRIPTION OF EMBODIMENTS

Figure 1:
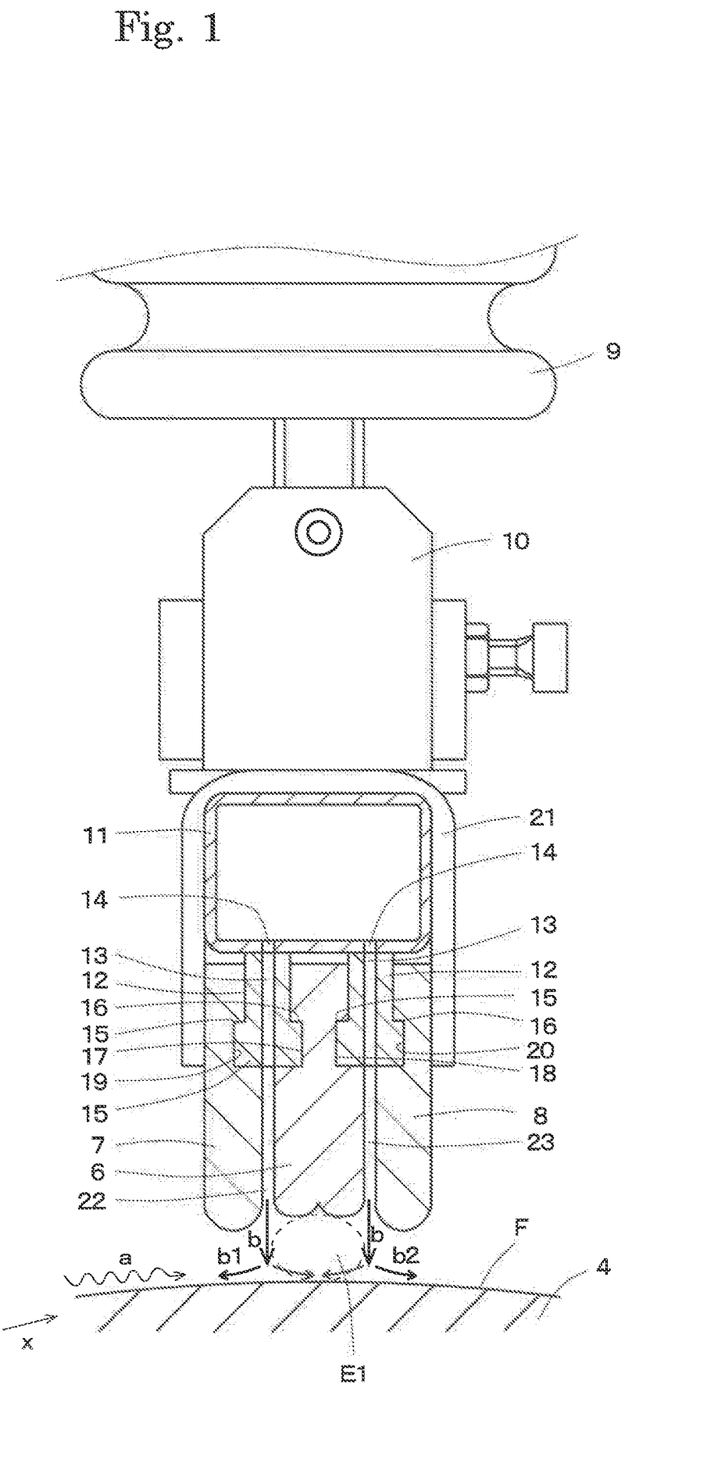
FIG. 1 is a partially sectional view around a discharge electrode according to a first embodiment.
Figure 2:
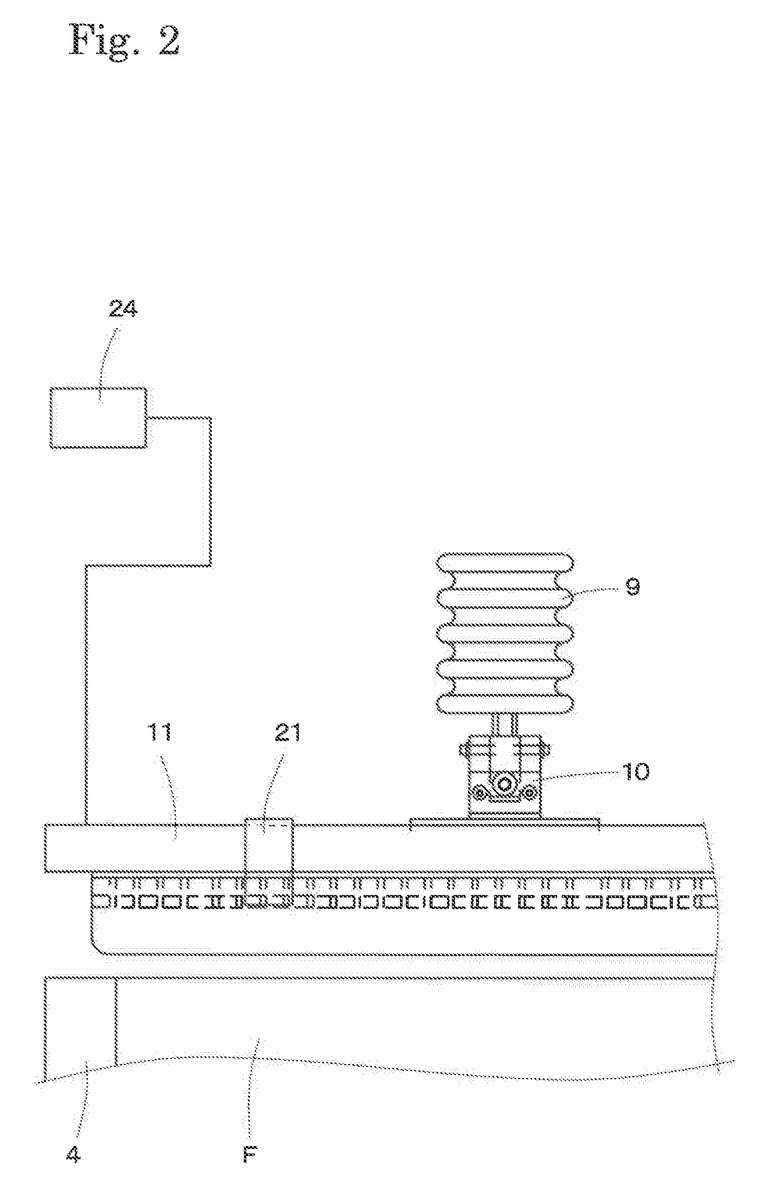
FIG. 2 is a side view in the first embodiment, seen in the length direction of the discharge electrode.

A device described in a first embodiment according to the present invention, illustrated in FIG. 1 and FIG. 2, includes a discharge electrode according to the present invention that is composed of a single electrode member 6 and placed to face the surface of a resin-made film F as a base material in order to modify the surface of the film F while being transferred in the direction of arrow x by a treatment roller 4 as a counter electrode.

The electrode member 6 is a member having a length in a width direction of the film F which is a direction perpendicular to the plane of the paper sheet of FIG. 1. As described in detail later, the electrode member 6 has both side faces respectively facing cover members 7, 8.

On the opposite side of the electrode member 6 from the treatment roller 4, a manifold pipe 11 is secured through a coupling member 10 and an insulator 9 secured to a frame which is not shown.

The manifold pipe 11 is connected with a gas supply source, not shown, to allow for a supply of substitution gas.

To the face of the manifold pipe 11 on the opposite side from the coupling member 10, a pair of support members 12, 12 extending along the manifold pipe 11 is secured with screws or the like, not shown, to keep a predetermined spacing between the support members 12, 12.

In each support member 12, a plurality of gas guide holes 13 are formed at regular intervals in the length direction of the support member 12. The gas guide holes 13 communicate with small holes 14 formed in the manifold pipe 11.

Thus, the substitution gas introduced into the manifold pipe 11 is guided from the small holes 14 into the gas guide holes 13 of the support member 12.

Further, engagement protrusions 15, 16 are formed at a distal end portion of the support member 12 to expand outward, so that the engagement protrusions 15, 16 are engaged with the electrode member 6 and the corresponding cover member 7, 8.

On the other hand, the electrode member 6 is a member with a length in the width direction of the film F which is the base material, the length corresponding to a required treatment width on the film F.

And, the electrode member 6 has both side faces respectively in which engagement recesses 17, 18 are formed to continue in the length direction. The engagement protrusions 16, 15 of the respective support members 12, 12 are fitted into the engagement recesses 17, 18, respectively.

In FIG. 1, also, the cover members 7, 8 placed on the both sides of the electrode member 6 are each a plate-shaped member made of insulating material, and engagement recesses 19, 20 are formed in faces of the respective cover members 7, 8 facing the electrode member 6, each engagement recess 19, 20 continuing in the length direction of the corresponding cover member 7, 8.

And, the engagement recess 19 of one cover member 7 of the cover members is engaged with the engagement protrusion 15 of one side of one of the paired support members 12, and the engagement recess 20 of the other cover member 8 is engaged with the engagement protrusion 16 of one side of the other support member 12.

As described above, the engagement recesses 19, 20 of the cover members 7, 8 are fit over the engagement protrusions 16, 15 of the support members 12 respectively facing the cover members 7, 8, whereby the cover members 7, 8 are located facing the electrode member 6 with the support members 12 interposed between the cover members 7, 8 and the electrode member 6. The electrode member 6 and the pair of cover members 7, 8 as described above are clamped together by a holder 21.

In this manner, the electrode 6 and the pair of cover members 7, 8 are clamped together by a holder 21, whereby the engagement recesses 17, 18 of the electrode member 6 and the engagement recesses 19, 20 of the cover members 7, 8 are not easily disjoined from the engagement protrusions 15, 16 of the support members 12, 12. Thus, the electrode member 6 and the cover members 7, 8 are firmly supported by the support members 12.

Further, in facing regions between the cover members 7, 8 and the electrode member 6 which are supported by the support members 12, slit-shaped facing gaps each have a length corresponding to that of the electrode member 6 and continuously extend to be open toward the treatment roller 4. The facing gaps serve as gas passages 22, 23. And, all the multiple gas guide holes 13 formed in the support members 12 communicate with the gas passages 22, 23.

It is noted that each of the manifold pipe 11, the support members 12 and the electrode ember 6 are composed of electrically conductive material, and the manifold pipe 11 is connected to a high-voltage power supply 24 (see FIG. 2) in order to cause a discharge between the electrode member 6 an the treatment roller 4.

Also, in the first embodiment, a controller, not shown, is provided to control output of the high-voltage power supply 24 which is a discharge energy source, and a rotation speed of the treatment roller 4.

It is noted that FIG. 1 depicts the large space between the distal end of the electrode member 6 and the treatment roller 4 and the large space between the cover members 7, 8 and the treatment roller 4 for the purpose of illustration, but typically, the space is set within several mm.

In the configuration as described above, when substitution gas is provided into the manifold pipe 11, the substitution gas flows through the small holes 14 and the gas guide holes 13 to be injected from the gas passages 22, 23 in the direction of arrow b. Specifically, the substitution gas shown by the arrow b is injected from between the electrode member 6 and the pair of cover members 7, 8, and then hits the film F to be diverted in directions of arrows.

At this state, a portion of the substitution gas escapes outward as shown by arrows b1, b2, but at this time, the spaces between the cover member 7 and the film F and the cover member 8 and the film F exert the throttle function so that fluid resistance is developed to increase the pressure inside the pair of cover members 7, 8.

Therefore, the substitution gas injected from each gas passage 22, 23 is pushed by the increased pressure as described above to be concentrated to a discharge area E1 which is formed in the facing region between the distal end of the electrode member 6 and the treatment roller 4.

In this manner, the substitution gas is supplied from the gas passages 22, 23 to the discharge area E1 in a concentrated manner. Because of this, the amount of supply of the substitution gas from the manifold pipe 11 is able to be significantly reduced as comparison with, for example, the case of maintaining the concentration of the substitution gas in the entire electrode chamber.

Further, the substitution gas is injected in a curtain form toward the treatment roller 4, so that the substitution gas functions as a gas curtain on the film F.

In particular, an entrained flow a can be blocked to prevent entry of outside air into the discharge area E1 by the substitution gas, shown by arrows b, that is injected from the gas passage 22 located upstream of the discharge area E1, that is, upstream of the discharge electrode, with reference to the moving direction x of the film F. Therefore, the substitution gas is able to be prevented from reducing in concentration and quality due to the entry of outside air into the discharge area E1.

In addition, the modification treatment is not influenced by gases mixed with external oxygen and/or the like and therefore the quality of the surface of the film F is not reduced.

Also, the substitution gas, which is injected from the gas passage 23 located downstream of the discharge area E1 with reference to the moving direction x of the film F, functions as a gas curtain for the substitution gas flowing outward from the discharge area E1. Therefore, the substitution gas is able to be prevented from flowing out of the discharge area E1.

In this manner, the substitution gas is injected from the gas passages 22, 23 made up of the facing gaps between the cover members 7, 8 and the electrode member 6, whereby the substitution gas is able to be supplied into the discharge area E1 and also an inflow of outside air and an outflow of the substitution gas can be prevented.

Because the inflow of outside air and the outflow of the substitution gas can be prevented as described above, the substitution gas concentration in the discharge area E1 can be maintained without an increase in the amount of supply of the substitution gas into the gas passages 22, 23, thereby achieving desired modification treatment.

Further, because the length of the gas guide hole 13 can be ensured corresponding to the support member 12, a throttle resistance is imparted to the gas flow passing through the gas guide hole 13. Therefore, a uniform pressure is maintained in the manifold pipe 11 upstream of the gas guide hole 13, and also the gas pressures emitted from the plurality of gas guide holes 13 become equal to one another. Further, even if there is a little change in pressure on the gas supply source side, the manifold pipe 11 functions as a buffer, so that more or less pressure variations on the gas supply source side produces little influence on the surface modification.

Further, the length of the gas guide hole 13 can be increased to some extent as described above. This is combined with the function of maintaining the pressure in the manifold pipe 11 to impart directivity to the gas flow emitted from the gas guide hole 13. Because the gas flow is given directivity in this manner, the diffusion of the substitution gas is prevented so that the substitution gas can be maintained at a constant concentration. Also, the directivity of the gas flow exerts the function of blocking the entrained flow a described above.

It is noted that the configuration to impart a throttle resistance to the gas flow on the upstream side of the gas passages 22, 23 is not limited to the gas guide holes 13. As long as a throttle resistance is imparted to the gas flow passing therethrough and the pressure in the manifold pipe 11 is maintained equally, for example, porous material such as porous sintered ceramics filter, a honeycomb filter, and the like may be used irrespective of its form.

Also, in the first embodiment, interposing the support members 12 between the electrode member 6 and the cover members 7, 8 causes each support member 12 to function as a spacer maintaining the facing gap, facilitating the facing gap being held constant.

Note however that the configuration to maintain the facing gap between the electrode member 6 and the cover member 7, 8 is not limited to the above-described configuration. For example, the electrode member 6 and the cover members 7, 8 may be secured directly to the manifold pipe 11 with a gap between them maintained, without use of the support members 12. Otherwise, instead of the manifold pipe 11, any other coupling jig or a fixing member may be utilized.

It should be understood that, in the first embodiment, a substitution gas passage is not formed within the discharge electrode composed of the electrode member 6, but the pair of gas passages 22, 23 formed along the cover members 7, 8 serve also the substitution gas passage and the gas curtain passage according to the present invention.

Figure 3:
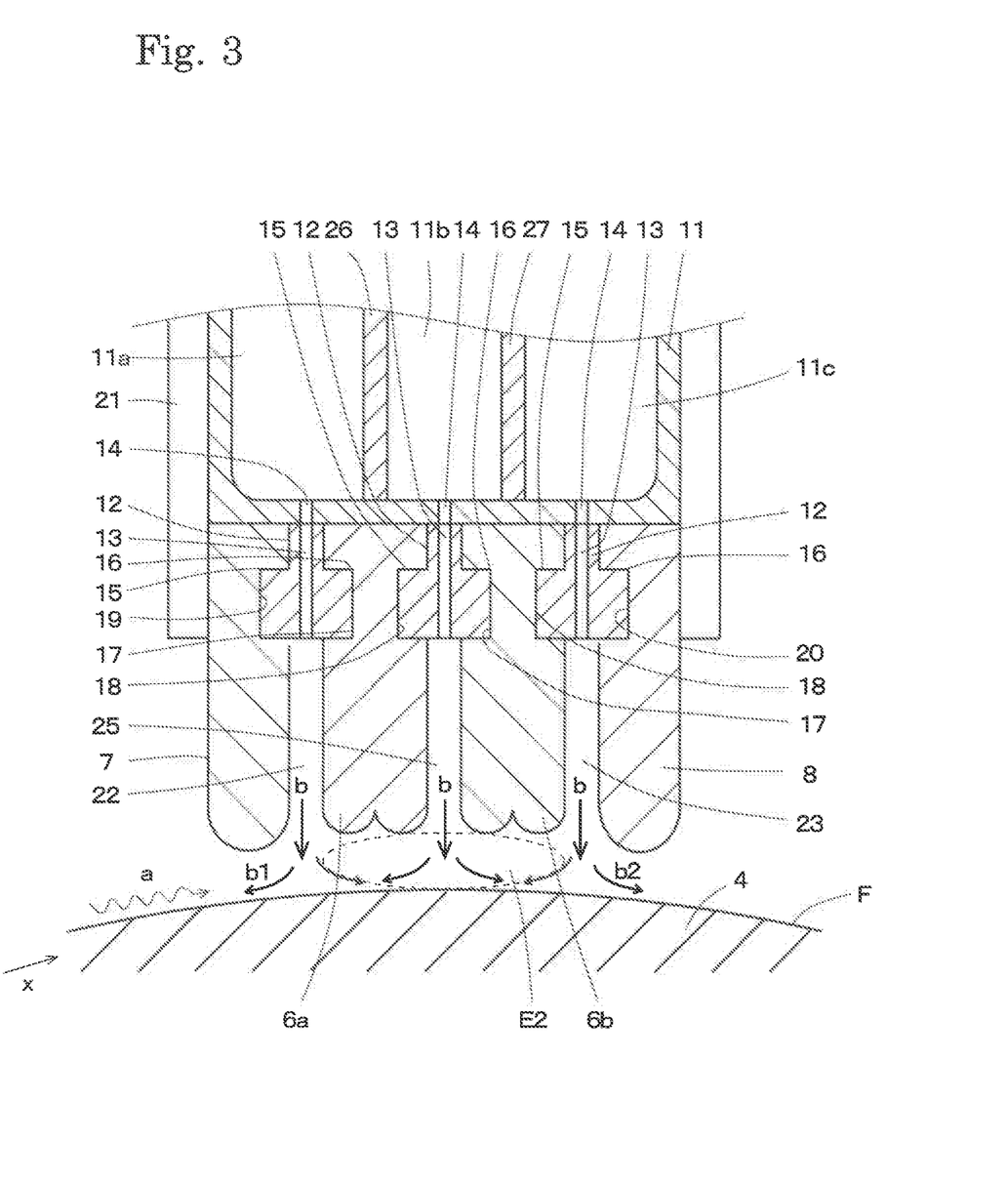
FIG. 3 is an enlarged sectional view of an electrode portion according to a second embodiment.

A device described in a second embodiment illustrated in FIG. 3 include a discharge electrode composed of two electrode members 6a, 6b, and the cover members 7, 8 placed on both sides of the discharge electrode. The electrode members 6a, 6b and the cover members 7, 8 are supported by use of three support members 12 each having the same structure as that of the support member 12 described in the first embodiment.

Other components that are similar to or the same as those in the first embodiment are designated using the same reference signs as those in FIG. 1, and details for each component are omitted.

In the second embodiment, the discharge electrode includes the electrode members 6a, 6b both of which are members with a length in the width direction of the film F and are identical in shape with the electrode member in the first embodiment.

One electrode member 6a of the two electrode members is supported to maintain a facing gap from the cover member 7 via the support member 12, and the facing gap is configured as the gas passage 22. The other electrode member 6b is supported to maintain a facing gap from the cover member 8 via the support member 12 different from the above, and the facing gap is configured as the gas passage 23.

In addition, another support member 12 different from the above support members 12 supporting the cover members 7, 8 is held between the electrode members 6a, 6b, and the resulting facing gap forms a slit-shaped gas passage 25. The gas passage 25 serves as a substitution gas passage formed within the discharge electrode according to the present invention.

In this manner, in the second embodiment, the three support members 12, 12, 12 are used to support the electrode members 6a, 6b and the cover members 7, 8. The assembly structure of each component to the three support members 12 is the same as that in the first embodiment, and the outer sides of the cover members 7, 8 are held by the holder 21.

Also, in the second embodiment, partition walls 26, 27 are mounted within the manifold pipe 11 to define first to third compartments 11a, 11b, 11c therein. The first to third compartments 11a, 11b, 11c are respectively empty spaces arranged along the electrode members 6a, 6b, which communicate with the gas passages 22, 25, 23 through the small holes 14 and the gas guide holes 13.

Upon supply of the substitution gas into each of the first to third compartments 11a to 11c, the substitution gas is injected from each gas passage 22, 23, 25 toward the treatment roller 4 as indicated by arrows b.

The substitution gas injected from each gas passage 22, 23 diverts along the surface of the film F, a portion of which flows outward as shown by arrows b1, b2, but the amount of outflow is minimized by the fluid resistance between the cover member 7, 8 and the film F. Thus, the substitution gas also functions as a gas curtain.

Therefore, the substitution gas injected from the gas passages 22, 23 is supplied to a discharge area E2 formed between the distal ends of the electrode members 6a, 6b and the treatment roller F.

Further, the substitution gas is also supplied to the discharge area E2 from the gas passage 25 formed between the pair of electrode members 6a, 6b.

In addition, an inflow of the entrained flow a and an outflow to the outside is minimized by the above-described gas curtain function, and thus the substitution gas in the discharge area E2 is maintained at a higher concentration.

It is noted that, because the discharge electrode is composed of the pair of electrode members 6a, 6b in the second embodiment, the facing area between the treatment roller 4 and the discharge electrode can be increased as compared with, for example, the case where the discharge electrode is composed of only the single electrode member 6 as described in the first embodiment. Specifically, the discharge area E2 is larger than the discharge area E1 in FIG. 1, and correspondingly, an increase in treatment speed of surface modification to the moving film F is possible.

Also, in the second embodiment, the substitution gas is also supplied to the gas passages 22, 23 formed along the cover members 7, 8, and the gas passages 22, 23 are configured to double as substitution gas passages and gas curtain passages. However, the gas passages 22, 23 may be configured to have only the function as the gas curtain passages without serving as the substitution gas passages. In this case, the substitution gas may be supplied to the second compartment 1ib of the manifold pipe 11 and a curtain gas of a different type from the substitution gas is supplied to the first and third compartments 11a, 11b.

Alternatively, any one of the gas passages 22, 23 may be configured to be dedicated to the gas curtain passage, and the other one may be configured to double as a substitution gas passage and a gas curtain passage.

And, the curtain gas supplied to the gas passage dedicated to the gas curtain passage is for blocking the gas layer along the surface of the film F, and is not intended to use for surface modification.

However, the gas injected toward the treatment roller 4 is inhibited from flowing outward as arrows b1, b2 by the function of the cover members 7, 8 as described above, so that the gas is inevitably supplied to the discharge area E2.

Hence, as a curtain gas of a different type from the substitution gas, there is a necessity to select a gas of a type having no adverse impact on a reaction of the substitution gas even if the gas flows into the discharge area E2 to some extent.

And, selecting a more inexpensive curtain gas than the substitution gas enables an achievement of desired modification treatment and simultaneously a reduction in cost.

Figure 4:
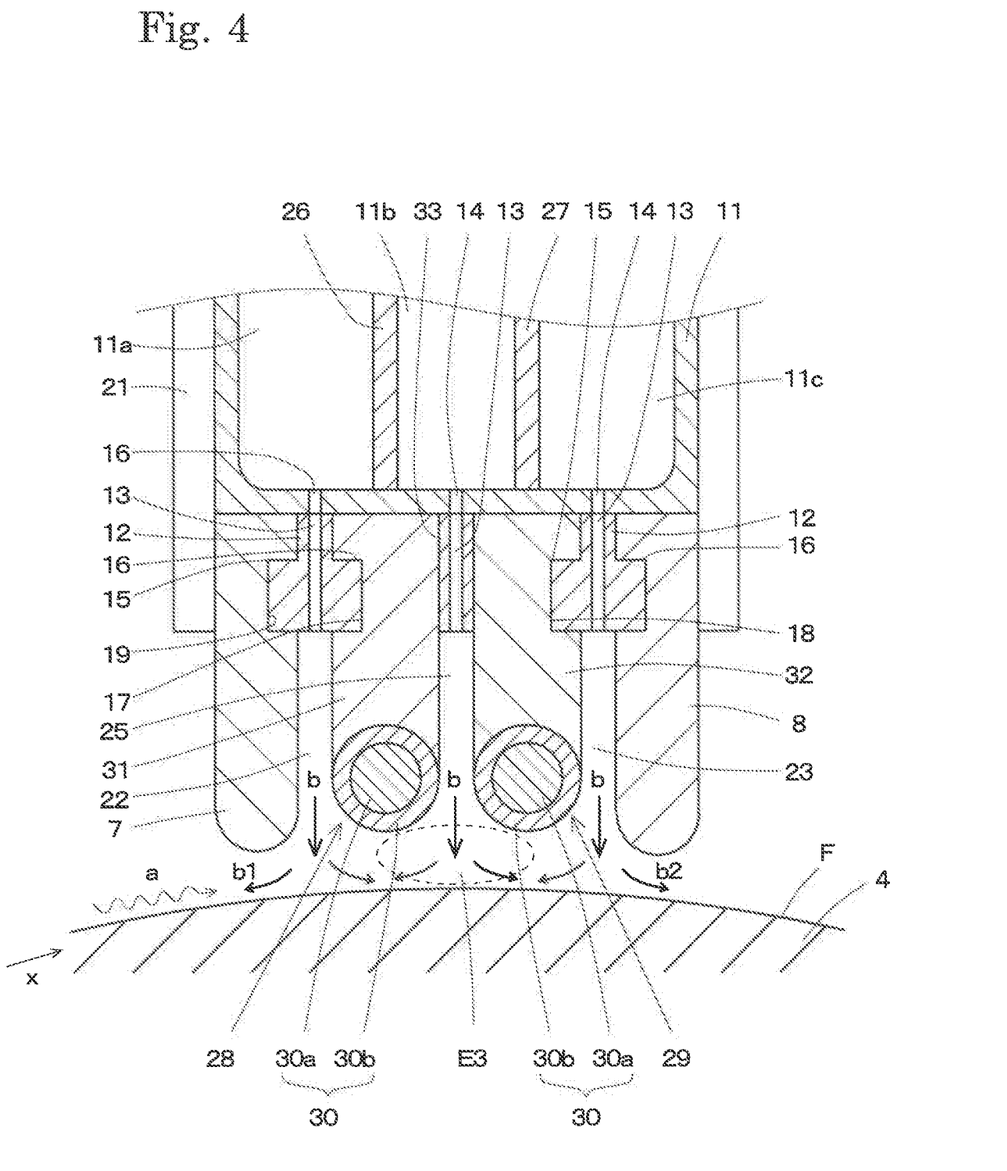
FIG. 4 is an enlarged sectional view of an electrode portion according to a third embodiment.

A third embodiment illustrated in FIG. 4 differs in the configuration of the electrode members 28, 29 placed between the cover members 7, 8, from the electrode members 6a, 6b in the second embodiment, but is approximately identical in other configurations with the second embodiment. Components similar to or the same as those in the second embodiment are designated using the same reference signs as those in FIG. 3, and details for each component are omitted.

The discharge electrode according to the third embodiment is composed of a pair of electrode members 28, 29.

The electrode members 28, 29 are members having a left-right symmetric shape in cross section illustrated in FIG. 4 and each having a length in the width direction of the film F, and the electrode members 28, 29 respectively include rod-shaped electrode portions 30, 30 coupled to distal ends of support portions 31, 32 made of insulating material.

Each electrode portion 30 is configured to include a rod-shaped metallic electrode 30a coated with a dielectric material 30b. High voltage is applied to the metallic electrode 30a to cause a discharge area E3 between the treatment roller R and the metallic electrode 30a. Stated another way, no voltage is applied to the manifold pipe 11 and the like as done in the above-described other embodiments.

In this manner, coating the metallic electrode 30a with the dielectric material 30b is to ensure the protection against an electrical short circuit between the discharge electrode and the treatment roller 4, and this is a configuration suitable for the purpose of providing more uniform modification treatment in the length direction of the discharge electrode.

Also, the support portions 31, 32 each have a similar length to the electrode portions 30, and have engagement recesses 17, 18 formed therein. And, the engagement recesses 17, 18 are engaged with the engagement protrusions 16, 15 of the support members 12 as in the case of the above-described other embodiments.

Further, a spacer member 33 is interposed between the support portions 31, 32 to keep a facing gap between the electrode members 28, 29, and the facing gap forms a slit-shaped gas passage 25. The gas passage 25 serves as a substitution gas passage formed within the discharge electrode according to the present invention.

And, a gas guide hole 13 is formed in the spacer member 33. And the gas guide hole 13 communicates with the small hole 14 formed in the manifold pipe 11, and also the spacer member 33 is secured to the manifold pipe 11 with a screw(s) not shown. Thus, the electrode members 28, 29 are held between the spacer member 33 and the support members 12.

Also, the cover members 7, 8 are engaged with the support members 12 and held by the holder 21 as in the case of the second embodiment.

In the third embodiment, upon supply of substitution gas into the first to third compartments 11a, 11b, 11c of the manifold pipe 11, the substitution gas is injected from the respective gas passages 22, 25, 23 toward the treatment roller 4 to be supplied to the discharge area E3 formed between the distal ends of the electrode members 28, 29 and the treatment roller 4.

Also, the substitution gas injected from the gas passages 22, 23 formed along the cover members 7, 8 also functions as a gas curtain, which blocks an entrained flow a on the film F to prevent entry of outside air into the discharge area E3, as well as to prevent the substitution gas from flowing outward.

In this manner, in the third embodiment, while the amount of supply of the substitution gas is maintained small, the concentration of the substitution gas is able to be maintained in the discharge area E3 to provide desired surface modification.

It is noted that the spacer member 33 is placed between the electrode members 28, 29 in the third embodiment, but the support member 12, instead of the spacer member 33, may be interposed. In this case, it is necessary to provide engagement recesses in the support portions 31, 32 of the electrode members 28, 29 for engagement with the engagement protrusions 15, 16 on the support member 12.

Also, the spacer member 33 may be used in lieu of the support member 12 between the electrode members 6a, 6b in the second embodiment illustrated in FIG. 3. However, a method of supporting the electrode members is not particularly limited.

Also, in the third embodiment, the partition walls 26, 27 may not be mounted in the manifold pipe 11. Alternatively, curtain gas may be supplied into the first and third compartments 11a, 11c within the manifold pipe 11 so that the gas passages 22, 23 may be used as dedicated passages for gas curtain.

It is noted that, where the partition walls 26, 27 are mounted in the manifold pipe 11 as described in the second and third embodiments, types of gas to be supplied to the respective compartments 11a, 11b, 11c can be changed. For example, the curtain gas may be supplied to the first and third compartments, or alternatively, different types of substitution gas may be supplied to each first, second, third compartment 11a, 11b, 11c.

Further, even if the same type of substitution gas is supplied to all of the first to third compartments 11, 111b, 11c, the supply pressure may be changed for each compartment.

Also, instead of mounting the partition walls 26, 27 in the single manifold pipe 11, three manifold pipes may be arranged for use.

Further, the curtain gas and/or the substitution gas may be supplied directly into the gas passages 22, 23, 25 without the manifold pipe 11.

However, an orifice mechanism or the like is preferably mounted to impart a throttle resistance on the upstream side of the gas passages such that the gas injection pressure is made uniform in the length direction of each slit-shaped gas passage 22, 23, 25.

Figure 5:
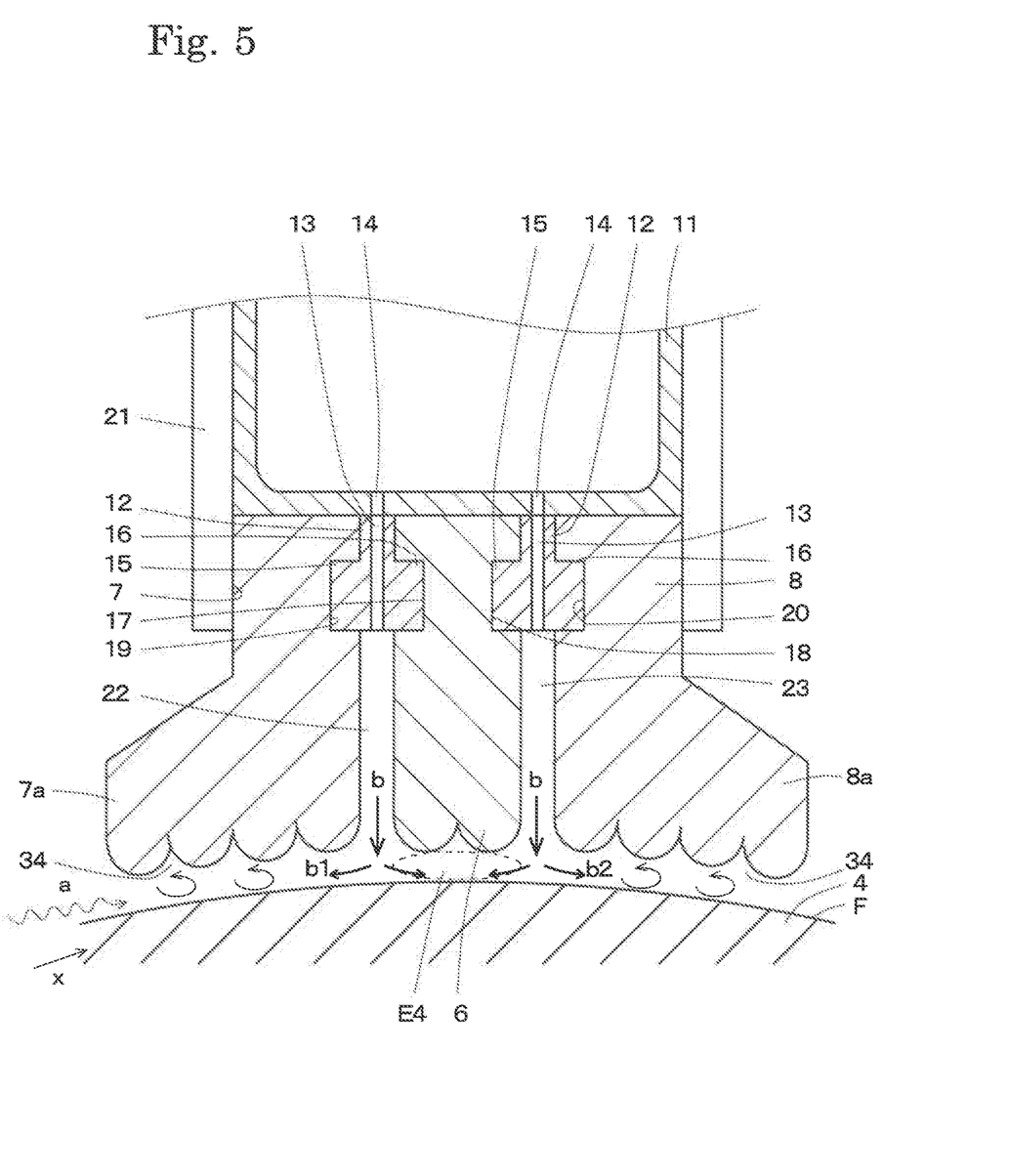
FIG. 5 is an enlarged sectional view of an electrode portion according to a fourth embodiment.

A fourth embodiment illustrated in FIG. 5 relates to a device including a configuration similar to that in the first embodiment, except for the shapes of the cover members 7, 8. Components similar to or the same as those in the first embodiment are designated using the same reference signs as those in FIG. 1, and details for each component are omitted. The following description is given with emphasis on differences from the first embodiment.

The cover members 7, 8 according to the fourth embodiment have, respectively, widened portions 7a, 8a in the respective distal ends each having a longer length in the direction along the moving direction x of the film F than the proximal end on the manifold pipe 11 side. Also, a vortex forming mechanism is included on the distal end face of each widened portion 7a, 8a, the vortex forming mechanism including a plurality of grooves continuing in the length direction of the cover member 7, 8.

In the fourth embodiment, the discharge electrode is composed of a single electrode member 6, and a substitution gas passage is not formed therein. However, the gas curtain passages 22, 23 formed along the cover members 7, 8 serve also as substitution gas passages.

In the fourth embodiment configured as described above, upon the supply of substitution gas to the manifold pipe 11, the substitution gas flows though the small holes 14 of the manifold pipe 11, then through the gas guide holes 13 of the support members 12 to be supplied to the gas passages 22, 23, and then the substitution gas is injected from the distal ends of the gas passages 22, 23 toward the film F. The substitution gas injected from the gas passages 22, 23 is supplied to the discharge area E4 and also functions as gas curtains.

Therefore, similarly to the above-described other embodiments, the concentration of the substitution gas is able to be maintained in the discharge area E4.

Further, in the fourth embodiment, because the length of the facing region between the treatment roller 4 and the widened portion 7a of the upstream cover member 7 is longer than the discharge area E4 with respect to the moving direction x of the film F, a choke function causes an increase in fluid resistance of gas flowing between the cover member 7 and the film F. Therefore, an outflow of the substitution gas as shown by arrow b1 is minimized to facilitate the supply of the substitution gas to the discharge area E4.

Also, because of the fluid resistance, the entrained flow a is hard to flow into the discharge area E4, thus further retarding the decrease in concentration of substitution gas in the discharge area E4.

Likewise, in the widened portion 8a of the cover member 8 downstream from the discharge area E4 with respect to the moving direction x of the film F, a choke function causes an increase in fluid resistance of gas flowing between the cover member 8 and the film F. Therefore, an outflow of the substitution gas as shown by arrow b2 can be decreased to minimize the consumption of substitution gas.

Further, because vortexes are formed at the distal ends of the widened portions 7a, 8a by the vortex forming mechanism 34, the inflow of entrained flow a and the outflow of substitution gas are further inhibited and the consumption of the substitution gas is reduced, while the desired surface modification can be obtained.

The cover members 7, 8 as described in the fourth embodiment are applicable to the above-described other embodiments, thereby the same advantageous effects as those in the fourth embodiment can be produced.

In the above-described first to fourth embodiments, the cover members 7, 8 are respectively placed on both the upstream side and the downstream side of the discharge electrode with reference to the moving direction x of the film F which is the base material so that the gas curtain passages are provided on both sides of the discharge electrode. However, the cover member 7, 8 may be mounted on only any one of the upstream side and the downstream side.

The gas curtain passage 22 formed by the upstream cover member 7 exerts the function of mainly preventing the entrained flow a from flowing into the discharge area. The prevention of the entrained flow from flowing into the discharge area in this manner enables stabilization of the substitution gas concentration in the discharge area. Accordingly, the upstream gas curtain passage is of particular usefulness to maintain the quality of surface modification.

And, where the cover member is mounted only on the upstream side of the discharge electrode with respect to the moving direction x of the film F, an outflow of the substitution gas toward the downstream side cannot be prevented.

However, on the downstream side from the discharge electrode, the outflow of the substitution gas cannot be prevented in a portion through which the film F undergone the surface modification treatment passes, and thereby even if a region where the substitution gas concentration decreases happens to be, the influence on the surface modification treatment does not seem to be very significant.

Accordingly, where stable quality of the surface modification is a main objective, the cover member is preferably mounted on the upstream side from at least the discharge electrode.

On the other hand, on the downstream side from the discharge electrode with respect to the moving direction x of the film F, the substitution gas tends to flow outward by accompanying the film F. Consequently, configuring the cover member mounted on the downstream side to form the gas curtain passage is particularly effective in a sense that the consumption of substitution gas is decreased.

Also, if the amount of substitution gas flowing outward excessively increases even on the downstream side, outside air ingress readily occurs accordingly. To address this, the gas curtain passage on the downstream side also exerts the effect of stabilizing the modification treatment.

And, it is apparent that, as described in the first to fourth embodiments, mounting the gas curtain passages on both the upstream side and the downstream side is the most desirable manner to provide the stabilization of surface modification and a reduction in consumption of the substitution gas.

Further, the number of electrode members forming the discharge electrode is not limited to one or two, and any number of three or more electrode members may be used. The larger number of electrode members, the greater number of substitution gas passages formed in the facing gaps between them, and also the wider discharge area to which the substitution gas is directly supplied. Consequently, an increase in throughput capacity for surface modification is enabled.

Further, in the second and third embodiments, the substitution gas passage formed in the discharge electrode is configured by use of the facing gap between adjacent electrode members. However, a slit-shaped gas passage may be formed in a single electrode member and may be used as a substitution gas passage. For example, the gas passage 3 of the conventional discharge electrode 2 shown in FIG. 6 may be used as a substitution gas passage. And, a cover member may be mounted on the outside along the length direction of the discharge electrode 2, and the facing gap between the discharge electrode 2 and the cover member may be used as a slit-shaped gas curtain passage. It is noted that a plurality of slit-shaped substitution gas passages may be formed in a single electrode member, or alternatively an arrangement of a plurality of electrode members as the discharge electrode 2 in FIG. 6 may be used.

It should be understood that forming a substitution gas passage by placing a plurality of electrode members to face each other with a gap between them maintained is easier than one or more slit-shaped substitution gas passages are formed in a single block electrode member.

Also, in the above-described embodiments, the manifold pipe 11 is used to supply gas into each gas passage. However, the manifold pipe is not absolutely necessary as long as required gas is supplied to each gas passage from a substitution gas supply source and/or a curtain gas supply source.

Moreover, a gas supply pressure and/or a throttle resistance may be adjusted to vary the injection pressure of gas injected toward the base material from each gas passage. For example, the injection pressure from the gas curtain passage may be set higher than the gas injection pressure from another/other substitution gas passage(s) in order to enhance the gas curtain function.

In the first to fourth embodiments, also, the gas curtain passages and the substitution gas passages are all arranged in parallel. However, the parallel arrangement of the gas passages is not necessary as long as required gas can be injected to a target position.

For example, where the surface of the counter electrode is curved as the treatment roller 4, a plurality of gas passages may be placed in the direction of the normal to the curved surface. Also, an arrangement of gas passages depending on a purpose is possible, such as the following: a substitution gas passage is formed to be aimed at the center of the discharge area in order for the substitution gas injected from the substitution gas passage to be hard to flow outward; the orientation of a gas curtain passage is set such that the injection direction of the curtain gas is adjusted to an entrained flow; and the like.

It should be understood that although the case of using the resin-made film as a base material has been described in the above-described embodiments, materials and forms of a base material are not limited to the above-described embodiments.

The surface modification device according to the present invention can be used for surface modification to base materials that are made of various materials and are of any form capable of being held within the discharge area formed between the discharge electrode and the counter electrode. For example, modification treatment can be performed on the surface of resin as well as paper, wood, metal and the like.

Further, the treatment roller, which is means for holding and transferring a film, also serves as the counter electrode in the first to fourth embodiments, but the counter electrode may be mounted separately from holding means and/or transferring means for the base material.

For example, a counter electrode may be mounted in a position on the opposite side of the film from the discharge electrode between a pair of transfer rollers between which the film as a base material is stretched. Alternatively, where a plate-shaped base material is held and transferred by a conveyor, a robot arm and the like, a counter electrode independent of the holding and transferring means may be mounted so that the base material is inserted into the discharge area formed between the counter electrode and the discharge electrode by the transferring means.

Also, in addition to metal, what metal is coated with a dielectric material may be used for the counter electrode and the electrode members forming the discharge electrode.

What at least any one of the discharge electrode and the counter electrode is coated with a dielectric material is particularly effective for a base material including a dielectric material. Where a base material is a dielectric material, a short circuit connected through the base material of low electrical resistance likely occurs between the discharge electrode and the counter electrode. And, once a short circuit occurs between the discharge electrode and the counter electrode, a stable discharge area is not created, thus disenabling desired modification treatment. However, as described above, if at least any one of the discharge electrode and the counter electrode is coated with a dielectric material, a short circuit as described above less occurs.

Note however that, even if the base material is an insulating material, where a purpose is surface modification using a soft and more uniform discharge in the length direction of the discharge electrode, the use of a counter electrode and/or a discharge electrode coated with a dielectric material is preferable.

Also, the length of the discharge electrode may be determined depending on a required treatment width on the surface of a base material. This required length may be provided not only by only one electrode member, but also by a plurality of electrode members coupled together in the length direction.

And, for the manifold pipe, the cover member and the support member mounted along the discharge electrode, and the like, a required length may be provided by coupling a plurality of members together.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A surface modification device, configured to supply substitution gas to a discharge area that is formed between a discharge electrode, which has a length in a width direction of a base material and includes one or more electrode members, and a counter electrode facing the discharge electrode, in order for a surface of the base material to be treated by discharge energy, the surface modification device comprising:
   a substitution gas passage that allows the substitution gas to be injected toward the discharge area along the discharge electrode;
   a cover member that includes an insulating material located along the discharge electrode and maintaining a facing gap from the discharge electrode;
   a gas curtain passage of a slit shape that is formed by the facing gap between the cover member and the discharge electrode; and
   a support member that is held between the discharge electrode and the cover member and has a gas guide hole formed therein to communicate with the gas curtain passage,
   wherein
   the cover member is mounted either any one or both of an upstream side and a downstream side of the discharge electrode with respect to a moving direction of the base material entering the discharge area formed between the discharge electrode and the counter electrode, and
   the gas curtain passage is supplied with curtain gas through the gas guide hole.

2. The surface modification device according to claim 1, wherein
   the facing gap is configured as the substitution gas passage of a slit shape, and
   the substitution gas is supplied to the substitution gas passage.

3. The surface modification device according to claim 2, wherein
   the discharge electrode includes a plurality of the one or more electrode members, some of which are adjacent to each other and face each other, and have a respective one of said support member held between them,
   said respective one of said support member has a gas guide hole formed therein to communicate with the gas passage, and
   the substitution gas is supplied to the substitution gas passage through the gas guide hole.

4. The surface modification device according to claim 1, wherein
   the gas curtain passage serves also as the substitution gas passage, and
   the substitution gas passage is supplied to the gas curtain passage.

5. The surface modification device according to claim 1, wherein
   the gas curtain passage is supplied with the curtain gas, and wherein the curtain gas is a different type of gas than the substitution gas.

6. The surface modification device according to claim 1, wherein
   the cover member has a vortex forming mechanism formed at a distal end face on the counter electrode side of the cover member.

7. A surface modification device, configured to supply substitution gas to a discharge area that is formed between a discharge electrode, which has a length in a width direction of a base material and includes one or more electrode members, and a counter electrode facing the discharge electrode, in order for a surface of the base material to be treated by discharge energy, the surface modification device comprising:
   a substitution gas passage that allows the substitution gas to be injected toward the discharge area along the discharge electrode;
   a cover member that includes an insulating material located along the discharge electrode and maintaining a facing gap from the discharge electrode;
   a gas curtain passage of a slit shape that is formed by the facing gap between the cover member and the discharge electrode;
   a support member that is held between the discharge electrode and the cover member and has a gas guide hole formed therein to communicate with the gas curtain passage; and
   a holder that clamps the cover member, the support member, and the discharge electrode
   wherein
   the cover member, the discharge electrode and the support member are clamped by the holder,
   the cover member is mounted either any one or both of an upstream side and a downstream side of the discharge electrode with respect to a moving direction of the base material entering the discharge area formed between the discharge electrode and the counter electrode, and
   the gas curtain passage is supplied with curtain gas through the gas guide hole.

8. The surface modification device according to claim 7, wherein
   the facing gap is configured as the substitution gas passage of a slit shape, and
   the substitution gas is supplied to the substitution gas passage.

9. The surface modification device according to claim 8, wherein
   the discharge electrode includes a plurality of the one or more electrode members, some of which are adjacent to each other and face each other, and have a respective one of said support member held between them,
   said respective one of said support member has a gas guide hole formed therein to communicate with the gas passage, and
   the substitution gas is supplied to the substitution gas passage through the gas guide hole.

10. The surface modification device according to claim 7, wherein
    the gas curtain passage serves also as the substitution gas passage, and
    the substitution gas passage is supplied to the gas curtain passage.

11. The surface modification device according to claim 7, wherein
    the gas curtain passage is supplied with the curtain gas, which is a different type of gas from the substitution gas.

12. The surface modification device according to claim 7, wherein the cover member has a vortex forming mechanism formed at a distal end face on the counter electrode side of the cover member.

\* \* \* \* \*